United States Patent
Gerna et al.

(10) Patent No.: US 8,963,621 B2
(45) Date of Patent: *Feb. 24, 2015

(54) METHODS AND APPARATUS FOR TUNING A CURRENT SOURCE AND SELECTING A REFERENCE VOLTAGE TO MAINTAIN A TRANSCONDUCTANCE AND TRANSITION FREQUENCIES OF TRANSISTORS OF AN INVERTER

(71) Applicant: Marvell World Trade Ltd., St. Michael (BB)

(72) Inventors: Danilo Gerna, Fino Mornasco (IT); Enrico Sacchi, Pavia (IT)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/191,845

(22) Filed: Feb. 27, 2014

(65) Prior Publication Data

US 2014/0176200 A1  Jun. 26, 2014

Related U.S. Application Data

(63) Continuation of application No. 13/310,541, filed on Dec. 2, 2011, now Pat. No. 8,665,005.

(60) Provisional application No. 61/419,645, filed on Dec. 3, 2010.

(51) Int. Cl.
| | | |
|---|---|---|
| G05F 1/10 | (2006.01) | |
| H03K 3/011 | (2006.01) | |
| G05F 3/24 | (2006.01) | |
| H02M 3/156 | (2006.01) | |
| H03K 3/012 | (2006.01) | |
| H03K 3/013 | (2006.01) | |

(52) U.S. Cl.
CPC ............... *H03K 3/011* (2013.01); *G05F 3/245* (2013.01); *H02M 3/156* (2013.01); *H03K 3/012* (2013.01); *H03K 3/013* (2013.01)
USPC ........................ 327/513; 327/512; 323/313

(58) Field of Classification Search
USPC ................................................ 331/185, 186
See application file for complete search history.

(56) References Cited

U.S. PATENT DOCUMENTS

| | | | |
|---|---|---|---|
| 4,128,816 | A | 12/1978 | Shimotsuma |
| 4,430,582 | A | 2/1984 | Bose et al. |
| 4,441,825 | A | 4/1984 | Morokawa |
| 4,477,737 | A | 10/1984 | Ulmer et al. |
| 5,796,295 | A | 8/1998 | Sharpe-Geisler |
| 6,686,792 | B2 | 2/2004 | Nakamiya et al. |

(Continued)

*Primary Examiner* — Thomas J Hiltunen

(57) ABSTRACT

A circuit including a current source, an inverter, and a device. The current source is configured to receive a first reference voltage and supply an output current. The inverter has a transconductance. The inverter includes a first transistor having a source and a drain and a second transistor having a source. The source of the first transistor is connected to the current source. The source of the first transistor is configured to receive a portion of the output current. The source of the second transistor is connected to the drain of the first transistor. The device is configured to select the first reference voltage such that the output current of the current source varies with changes in a temperature of the current source to maintain the transconductance of the inverter at a same value and prevent changes in respective transition frequencies of both the first transistor and the second transistor.

23 Claims, 10 Drawing Sheets

(56) References Cited

U.S. PATENT DOCUMENTS

| | | |
|---|---|---|
| 6,803,803 B1 | 10/2004 | Starr et al. |
| 7,471,152 B2 | 12/2008 | Jiang et al. |
| 7,573,346 B2 * | 8/2009 | Hagino .................... 331/160 |
| 7,834,683 B2 | 11/2010 | Truong et al. |
| 7,898,332 B2 * | 3/2011 | Deguchi et al. ............ 330/259 |
| 8,035,443 B2 * | 10/2011 | Narathong et al. ........... 330/51 |
| 8,143,963 B2 | 3/2012 | Lin et al. |
| 8,665,005 B2 * | 3/2014 | Gerna et al. ................ 327/513 |
| 8,680,925 B2 * | 3/2014 | Christen .................... 330/297 |
| 2008/0061893 A1 | 3/2008 | Lakshmikumar et al. |
| 2008/0084249 A1 | 4/2008 | Noguchi |
| 2009/0201067 A1 | 8/2009 | Haneda |

* cited by examiner

METHODS AND APPARATUS FOR TUNING A CURRENT SOURCE AND SELECTING A REFERENCE VOLTAGE TO MAINTAIN A TRANSCONDUCTANCE AND TRANSITION FREQUENCIES OF TRANSISTORS OF AN INVERTER

CROSS REFERENCE TO RELATED APPLICATIONS

The present disclosure is continuation of U.S. patent application Ser. No. 13/310,541 (now U.S Pat. No. 8,665,005), filed on Dec. 2, 2011. This application claims the benefit of U.S. Provisional Application No. 61/419,645 filed on Dec. 3, 2010. The entire disclosures of the applications referenced above are incorporated herein by reference.

FIELD OF USE

Particular embodiments generally relate to systems, circuits, and methods for making and operating inverters with constant transconductance ($G_M$) for inverting digital signals having reduced or limited phase noise variation regardless of operating temperature or process corner with the lowest possible power consumption.

BACKGROUND

Unless otherwise indicated herein, the approaches described in this section are not prior art to the claims in this application and are not admitted to be prior art by inclusion in this section.

A schematic representation of a typical electronic inverter 100 is shown in FIG. 1. In such inverters, an incoming signal 110 having a specific frequency and form is fed into input 115 of the inverter 100. Input 115 is coupled to the gates of pMOS transistor 120 and nMOS transistor 125, as shown in FIG. 1. The pMOS 120 and nMOS 125 transistors are biased across the $V_{DD}$ drain 130 and $V_{SS}$ source 135 using a static or dynamic voltage based on a reference voltage applied at $V_{DD}$ drain 130. $V_{SS}$ source 135 can be tied to ground in some implementations. The inverted signal 160 is then output on terminal 140 that is coupled to the drain lead of pMOS transistor 120 and the drain lead of the nMOS transistor 125. The output is loaded by capacitor 150 coupled to the terminal 140 and the drain lead of the nMOS transistor 125.

The speed of electronic inverters, like inverter 100, that use MOS transistors, is dependent on the transit frequencies of the pMOS and nMOS transistors 120 and 125. The transit frequency of a MOS transistor describes the speed at which the transistor can be operated. The transit frequencies of the pMOS and nMOS transistors 120 and 125 varies with the transconductance, $G_M$, of the pMOS and nMOS transistors 120 and 125. Thus, if the $G_M$ of the pMOS and nMOS transistors 120 and 125, and consequently the transit frequencies of the pMOS and nMOS transistors 120 and 125, can be kept substantially constant over temperature and process corner variations, then the transition speed of the inverter will also remain constant, or at least within an acceptable range. When the transition speed of the inverter is constant or within an acceptable range, its contribution to overall phase noise or phase noise variation can be reduced or eliminated.

Maintaining constant transit frequencies in the pMOS and nMOS transistors 120 and 125, requires that the transistors be biased with varying voltages that corresponds to the threshold and mobility variation in the transistors due to the temperature and process corner variations in a given operating condition to maintain constant transconductance across the transistors. For example, in situations with fast-corner signals at relatively low temperature, there is no need for a high $V_{DD}$ 130 for the inverter to function a sufficiently high speeds, because the transfer frequency of the inverter will be high enough to supply a signal to other electronic components with little to no phase noise. However, in slow-corner scenarios at high temperatures, or high PT, the transfer frequency of the inverter may be too slow for high speed applications. To compensate for the relatively low transfer frequency of the inverter components, i.e. the pMOS and the nMOS devices 120 and 125, at higher temperatures, the reference voltage, $V_{DD}$, can be increased to increase the transconductance, $G_M$, of the transistors, and, consequently, the operational speed of the inverter. Ensuring that the inverter operates at speeds sufficient to keep up with frequency of the incoming signal or waveform, helps to reduce or eliminate phase noise injected into any system or device in which the inverter is used.

One fail safe method of ensuring that the inverter will always operate to transition the incoming signal at sufficiently high speeds with limited, if any, added phase noise, is to operate the inverter with a relatively high $V_{DD}$. This usually means operating the inverter with a reference voltage, $V_{DD}$, set for the worst case scenario in which the inverter would be expected to operate, i.e. the highest operating temperature. Unfortunately, this means that more power would be used for supplying the high $V_{DD}$ than is necessary for most conditions which, of course, results in higher power consumption than is necessary for most scenarios. Obviously, unnecessary high power consumption is not a desirable characteristic for most electronic devices.

Assuming linear performance of the transconductance, $G_M$, of the transistors, if an inverter can be biased with a voltage or current in the middle of a transition, then the phase noise and the rate of the transition can also be kept constant. To maintain constant $G_M$ in the inverter, the reference voltage applied to $V_{DD}$ can be varied based on simulated operation or measurement of operational parameters in actual use that can be used to adjust the reference voltage to maintain constant transition frequency and phase noise. However, contemporary systems for adjusting the $V_{DD}$ to maintain constant operation of the inverter often time require expensive active systems with computational logic, sensors and calibrated look-up tables.

SUMMARY

Embodiments of the present disclosure are directed toward apparatus that include a current source, a first transistor having a first drain lead coupled to the current source, a second transistor having a second drain lead coupled to a first source lead of the first transistor, a first gate lead of the first transistor, and a second gate lead of the second transistor. Such embodiments also include a buffer coupled to the first drain lead of the first transistor. An output current of the current source varies with temperature at a first rate that corresponds to a second rate at which a transconductance value of the first transistor and the second transistor varies with temperature to provide a circuit that is insensitive to process, voltage, and temperature (PVT) variation.

Other embodiments of the present disclosure include methods for operating a circuit, such as an inverter, to produce a digital output with limited noise and reduced power consumption. Such methods include setting a reference voltage to a first value where an output current varies with the temperature variation at a first rate at which a transconductance of a first transistor and a second transistor remains constant with the temperature variation. Setting the reference voltage can include selecting the reference voltage in response to simulated operation or experimentally derived measurements of the current source. Such methods can also include adjusting the reference voltage to a second value at which the transconductance of the first and second transistors remains constant with the temperature variation in response to the measured transconductance of the circuit.

The following detailed description and accompanying drawings provide a more detailed understanding of the nature and advantages of the present invention.

DETAILED DESCRIPTION

Described herein are techniques for circuits and methods for making and operating inverters with constant transconductance ($G_M$) for inverting digital signals having reduced or limited phase noise variation in view of operating temperature or process corner variations, while also maintaining a desired power consumption. Embodiments of the present invention are directed toward passive devices, systems and methods for sensing and adjusting the reference voltage, $V_{DD}$, to maintain constant inverter performance in view of external and internal device requirements, temperature, and incoming and outgoing signal types. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
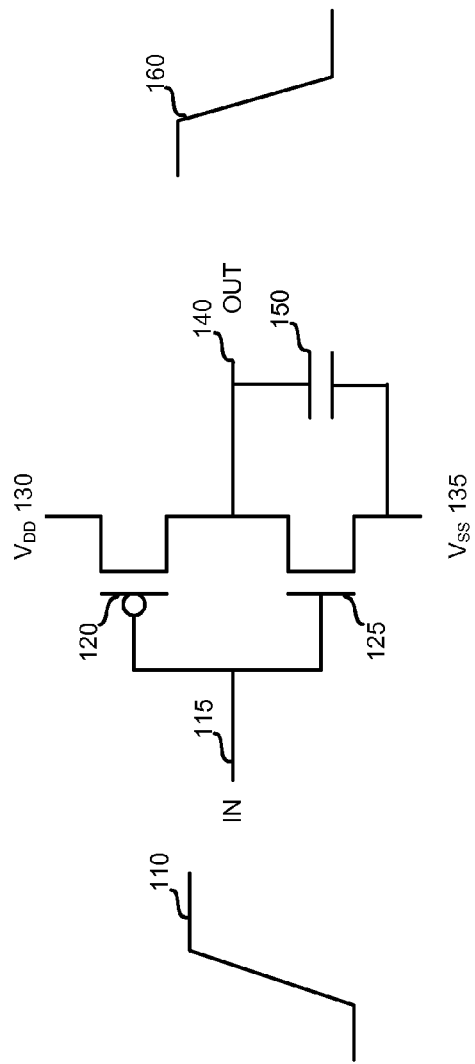
FIG. 1 is a schematic representation of a typical electronic inverter.
Figure 2:
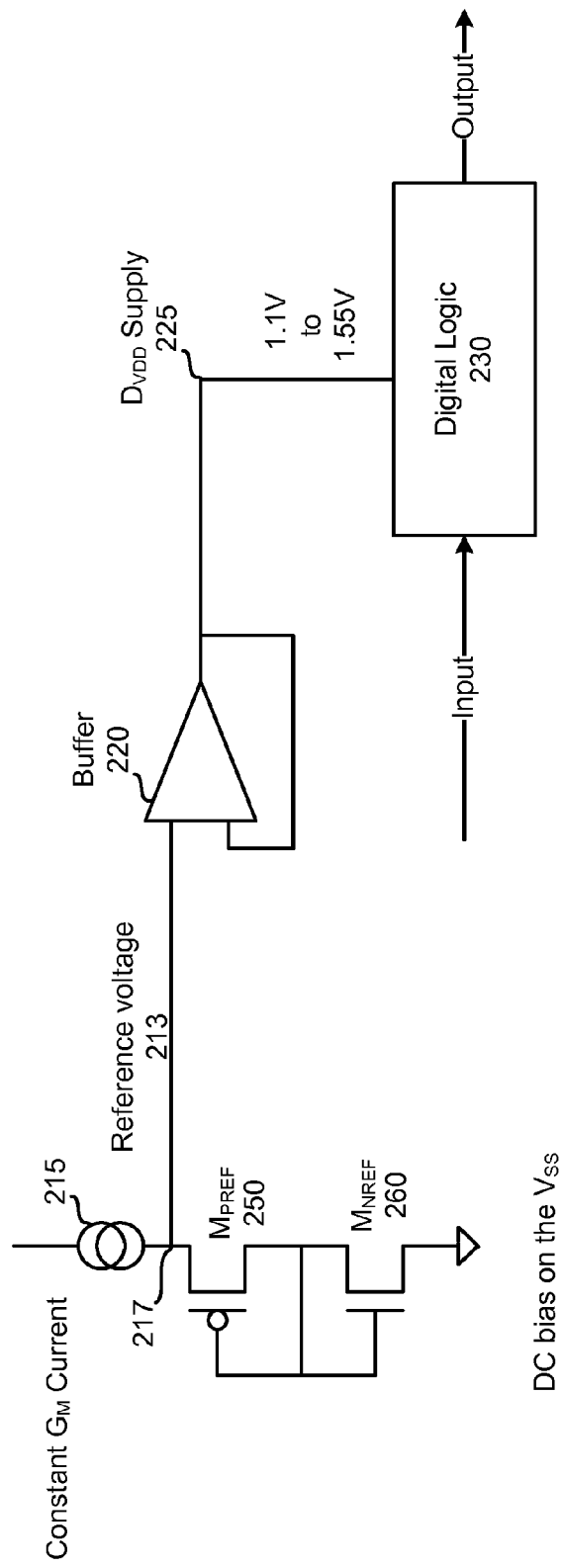
FIG. 2 is a schematic representation of an electronic inverter and the supplied device according to one embodiment.

FIG. 2 shows a schematic representation of inverter circuit 200 according to various embodiments of the present disclosure. The inverter can include a current source that can vary with temperature, such as constant $G_M$ current generator 215, coupled to MOS transistors $M_{PREF}$ 250 and $M_{NREF}$ 260 and buffer 220. As shown, the constant $G_M$ current generator 215 is coupled to the drain lead of transistor $M_{PREF}$ 250. The source lead of transistor $M_{PREF}$ 250 is coupled to the drain lead of the $M_{NREF}$ 260 and the gates of both transistors. The source lead of transistor $M_{NREF}$ 260 can be biased with a source voltage, $V_{SS}$.

In such embodiments, the inverter can be biased with a constant $G_M$ current. The constant $G_M$ current 215 refers to a current that can vary to maintain constant transconductance, $G_M$, across the pMOS and nMOS transistors, $M_{PREF}$ 250 and $M_{NREF}$ 260, regardless of variations in temperature and process corners. By maintaining constant $G_M$ in the transistors, the transit frequencies of the transistors is also kept relatively constant. Since the phase noise of the inverter is proportional to the variation in transit frequencies of the transistors, the variation in phase noise can be reduced or eliminated by using constant $G_M$ current. In some embodiments, the voltage source, $V_{SS}$, can be biased with a DC voltage to produce the required voltage drop over the transistors.

During use, as the temperature increases, the charge mobility of the transistors decrease, so that the threshold voltages of the transistors $M_{PREF}$ 250 and $M_{NREF}$ 260 also increase. Accordingly, to maintain constant transconductance, $G_M$, and consequently constant or relatively invariant transit frequencies in the transistors, the current from 215 must also increase as the temperature increases. Constant $G_M$ current is the current that produces a reference voltage 213 that can be coupled to the unity gain buffer 220 to produce a separated and inverted $D_{VDD}$ supply 225 to another digital logic 230, such as a high speed divider, with minimal phase noise.

The $M_{PREF}$ 250 and $M_{NREF}$ 260 transistors measure the voltage across the drain source due to the constant GM current. Each of the transistors are capable of 100 mV swings of the respective threshold voltage such that the voltage at the point 217 can swing by approximately 200 mV. If the gate voltage in of the pMOS transistor is held above the threshold voltage, then the voltage at 217 goes up. In the circuit 200, if the $D_{VDD}$ goes up, then, because of buffer 220, the voltage at point 217 will also go up automatically. This allows the $D_{VDD}$ supply to digital logic 230 to be precisely what the circuit needs to operate without wasting power which can result from setting the reference voltage too high for a particular digital logic 230 or operating temperature. Accordingly, the transconductance across the pMOS transistor and the nMOS transistor remains relatively constant over process, voltage and temperature variation (PVT variation) of the nMOS and pMOS used to generate the reference voltage using the constant GM current.

Figure 3:
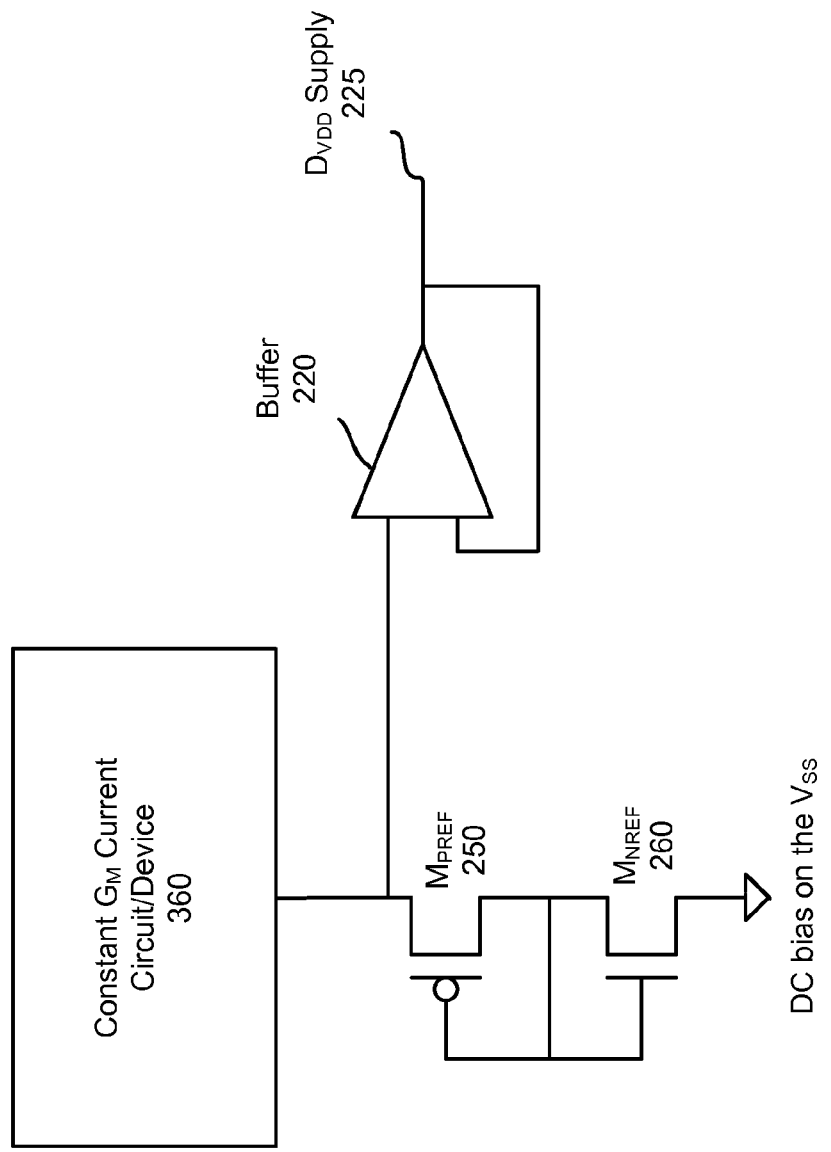
FIG. 3 is a schematic representation of a process and temperature insensitive electronic inverter according to one embodiment.

FIG. 3 shows a schematic representation of inverter circuit coupled to a constant $G_M$ current circuit/device 360, according to various embodiments of the present disclosure. As discussed above, the current used to bias the transistors 250 and 260 and the buffer 220 needs to vary with temperature and process corners to compensate for the variation in mobility and threshold voltages. Various devices can be used to implement the constant $G_M$ current circuit/device 360, including, but not limited to, the examples discussed herein in reference to FIGS. 4-8.

Figure 4:
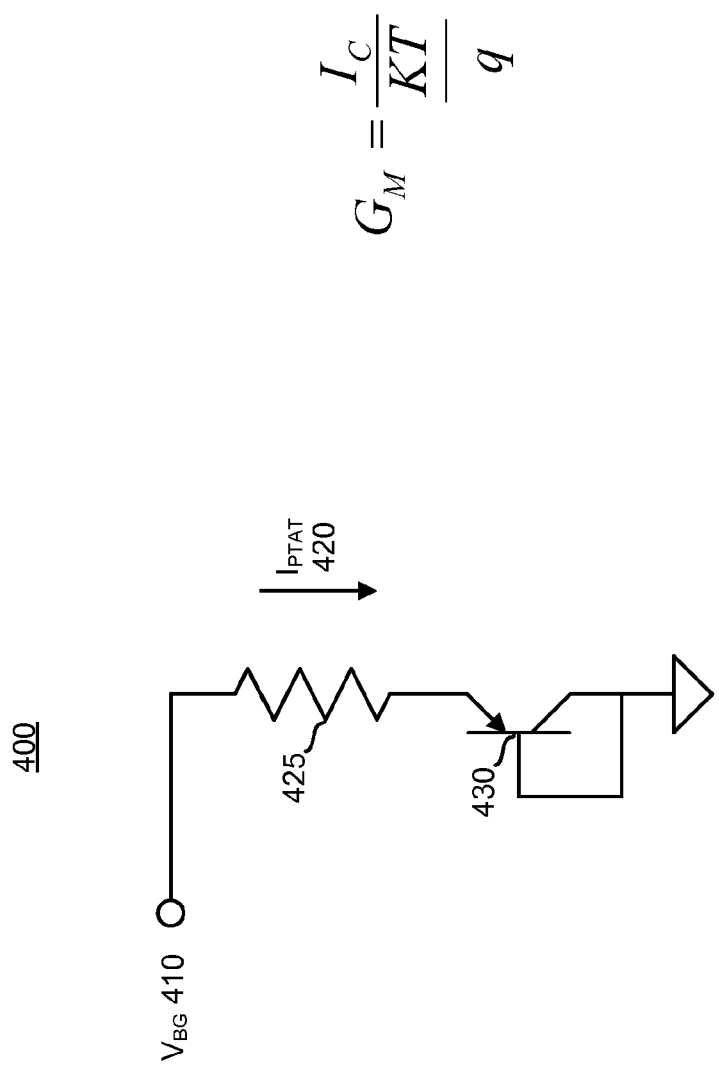
FIG. 4 is a schematic representation of a proportional-to-absolute-temperature (PTAT) circuit that can be used to implement various embodiments.

One technique for providing the varying constant $G_M$ current is to use a type of proportional-to-absolute-temperature (PTAT) circuit or device, like the one shown in FIG. 4. As shown, the PTAT can include a resistor 425 coupled to a bipolar junction transistor (BJT) 430. Resistor 425 can be tuned to a specific resistance based on analysis performed by techniques and methods described herein. In some embodiments, the resistor can be digitally tunable, while in other embodiments, the resistor is tuned by mathematical analysis or trial and error.

In PTAT type devices, the current increases with temperature. The reference voltage in a PTAT can be a bandgap voltage $V_{BG}$, of approximately 1.2V. The slope increase of current with temperature in bipolar junction transistor (BJT) devices is ~1/273.15 C. However, when using a MOS transistor, which can be approximated as a bipolar transistor in most implementations, the slope of the current versus the temperature needed to keep the transconductance, $G_M$, constant is steeper. Thus, the slope of the current versus temperature in the MOS transistor can be adjusted to provide the proper current to keep the transconductance of the MOS transistors constant.

When a voltage $V_{BG}$ is applied to the resistor 425, a current, $I_{PTAT}$, that is proportional to the temperature of the circuit, including BJT 430 and resistor 425, results in a current $I_{PTAT}$ such that $I_{PTAT} \sim 1/273 * T$, wherein T is the temperature of the circuit 400 in degrees Kelvin. It follows that as the voltage $V_{BG}$ is reduced, the rate of change of the variation of the current with temperature will decrease. This relationship between the $V_{BG}$ and the slope of $I_{PTAT}$ as a function of temperature is useful for analysis and various method embodiments of the present disclosure. As used herein, the terms slope and rate of change can be used interchangeably to refer to the relationship between the variation between two or more variable or data points.

Figure 5:
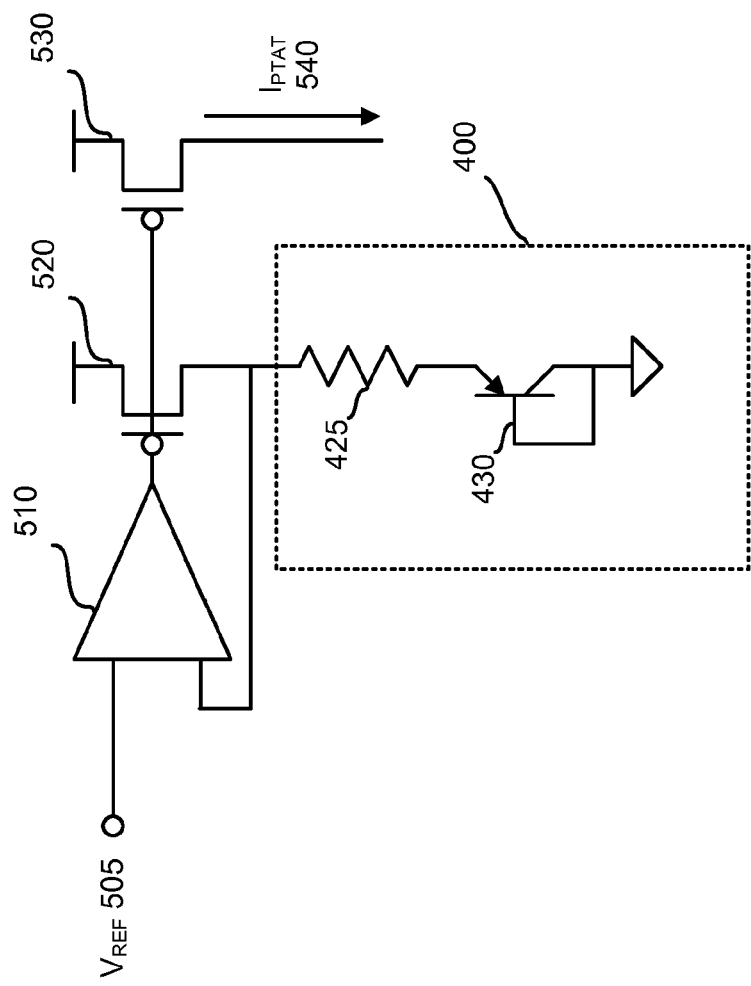
FIG. 5 is a schematic representation of a proportional-to-absolute-temperature (PTAT) circuit that can be used to implement various embodiments.

FIG. 5 shows another example of a possible $I_{PTAT}$ circuit 500 that can be used in various embodiments. As shown, the resistor 425 of circuit 400 can be coupled to one input of a buffer 510 and two pMOS transistors 520 and 530 via the source lead of transistor 520 as shown, such that when a $V_{REF}$ 505 is coupled to the other input of the buffer 510, $I_{PTAT}$ 540 varies with the temperature.

Figure 6:
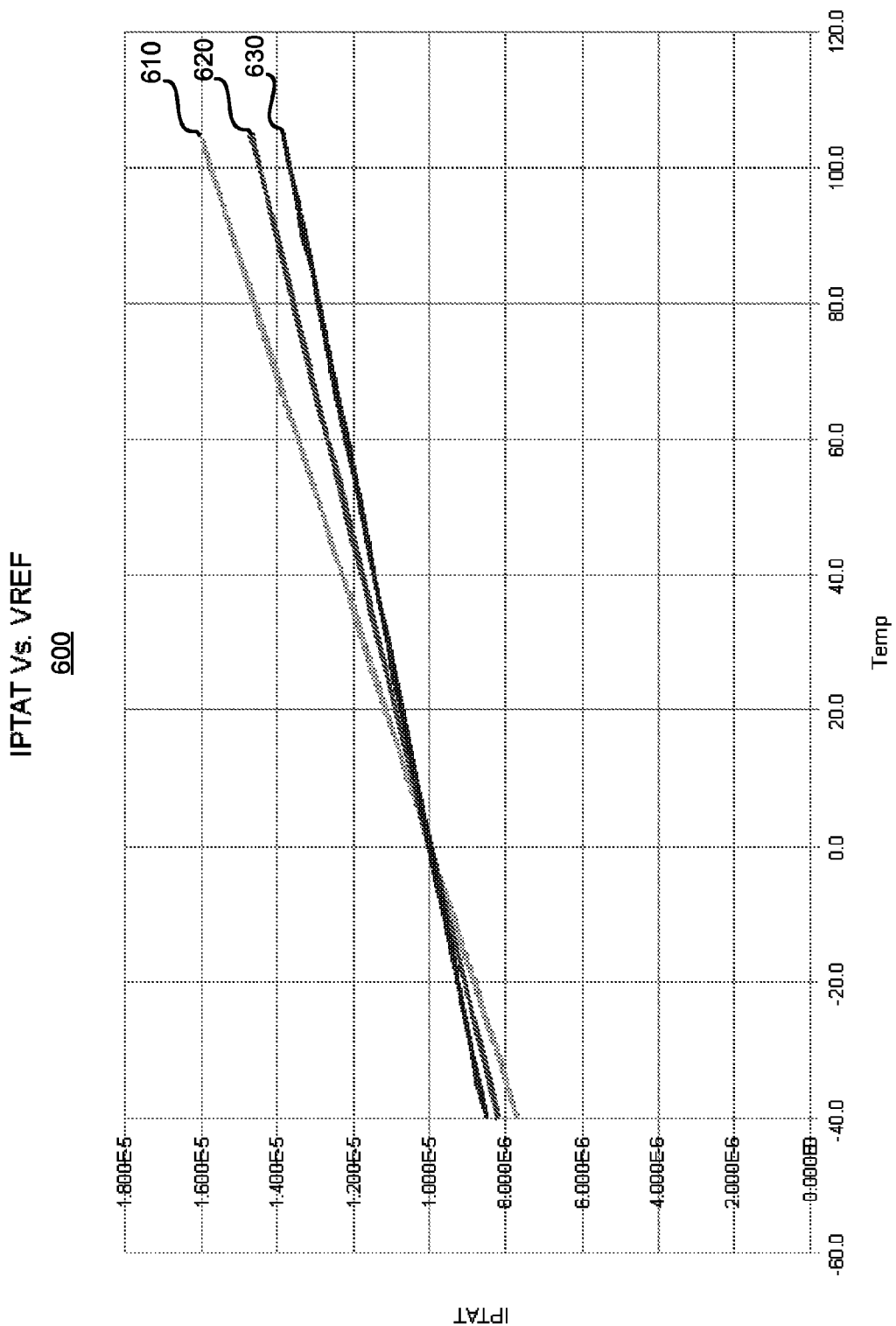
FIG. 6 is a graph of the output current from an PTAT circuit versus temperature at three reference voltages.

FIG. 6 shows a graph 600 of the output current of a representative PTAT device, $I_{PTAT}$, versus temperature with the $V_{REF}$ set to three different $V_{REF}$ voltages represented by lines 610, 620, and 630. The slope of the current, $I_{PTAT}$, versus temperature varies inversely with $V_{REF}$. Once the desired $V_{REF}$ is determined, that voltage can be held to produce the varying current needed by the MOS transistors to provide the transition performance needed in the inverter. FIG. 6 shows the results of a simulation that shows a relationship of current in the PTAT device ($I_{PTAT}$) versus the temperature at three different $V_{REF}$s. The $V_{REF}$ 610=1.2V, $V_{REF}$ 620=1.1V, and $V_{REF}$ 630=1.0V. As shown, the slope of $I_{PTAT}$ versus temperature is greater for higher $V_{REF}$ voltages.

To provide easy comparison and analysis of the $I_{PTAT}$ curves, it is convenient to have the lines intersect at some temperature, as shown in FIG. 6 where the lines intersect at 0 degree K. This indicates that the value of the resistor in the PTAT devices 400 or 500 may need to be tuned to give the same current at 0 degrees K, or some other temperature, for all three $V_{REF}$ voltages, as shown in FIG. 6, otherwise the comparison of the various slopes due to varying the $V_{REF}$ would not be meaningful. Since power consumption follows the square of the $V_{REF}$, it is advantageous to keep $V_{REF}$ as low as possible to achieve the desired performance characteristics. Embodiments of the present disclosure advantageously facilitate maintaining the lowest possible $I_{PTAT}$ necessary while reducing or eliminating the phase noise injected by the inverter.

Figure 7:
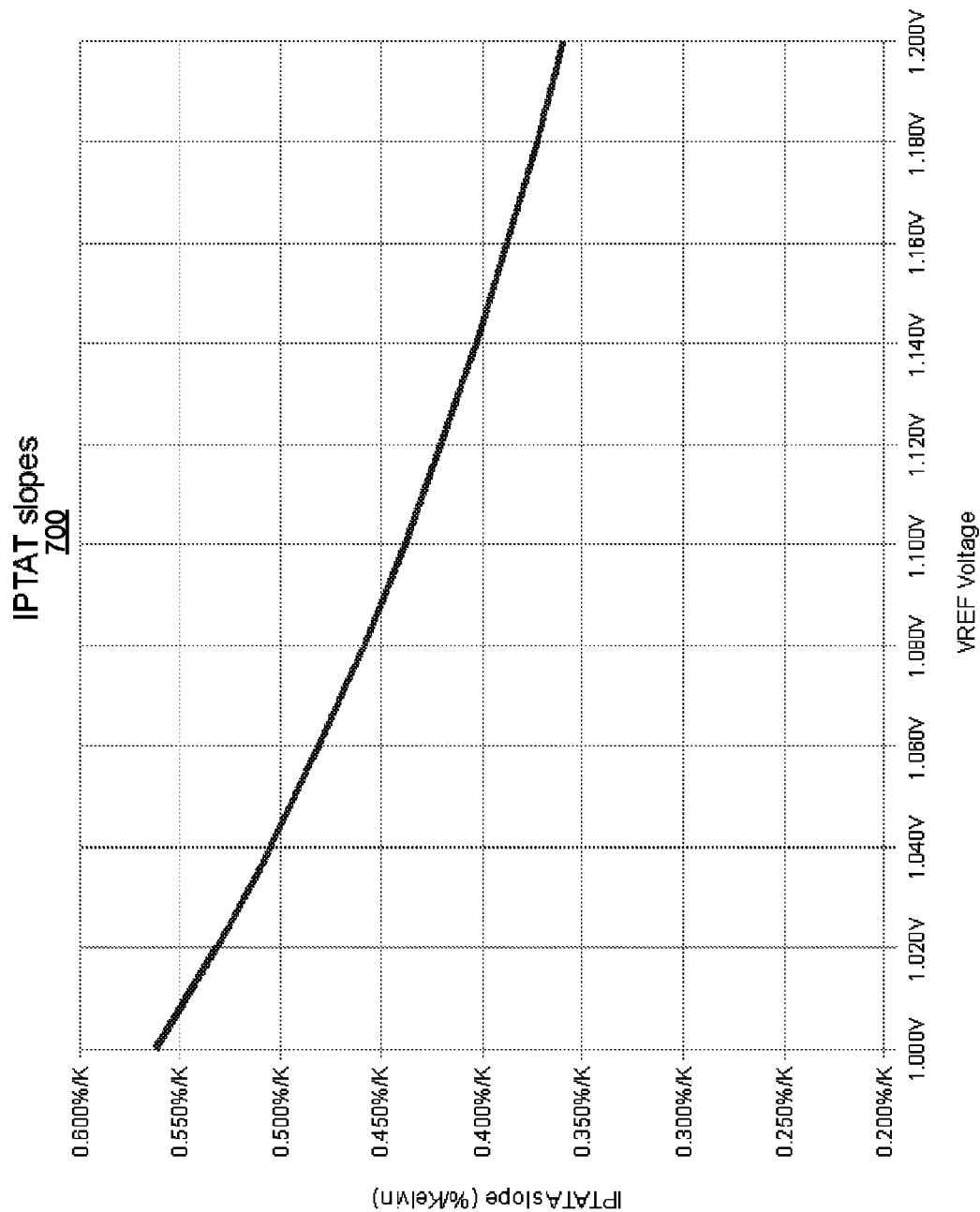
FIG. 7 graph of the linear slope of the current from an PTAT circuit with respect to the changes in temperature over a range of reference voltages.

FIG. 7 is shows a chart of the slopes of the $I_{PTAT}$ versus temperature as a function of $V_{REF}$. This chart helps visualize the correlation between $I_{PTAT}$ versus temperature as a function of $V_{REF}$. As can be seen, the slope of $I_{PTAT}$ versus temperature decreases as the $V_{REF}$ increases. Accordingly, $V_{REF}$ and a resistor value 425 can be chosen to provide a $I_{PTAT}$ current that varies with temperature to match the current needed to maintain constant GM and transition frequencies in the pMOS and nMOS transistor in the inverter so as to reduce or eliminate phase noise during the inversion process.

Figure 8:
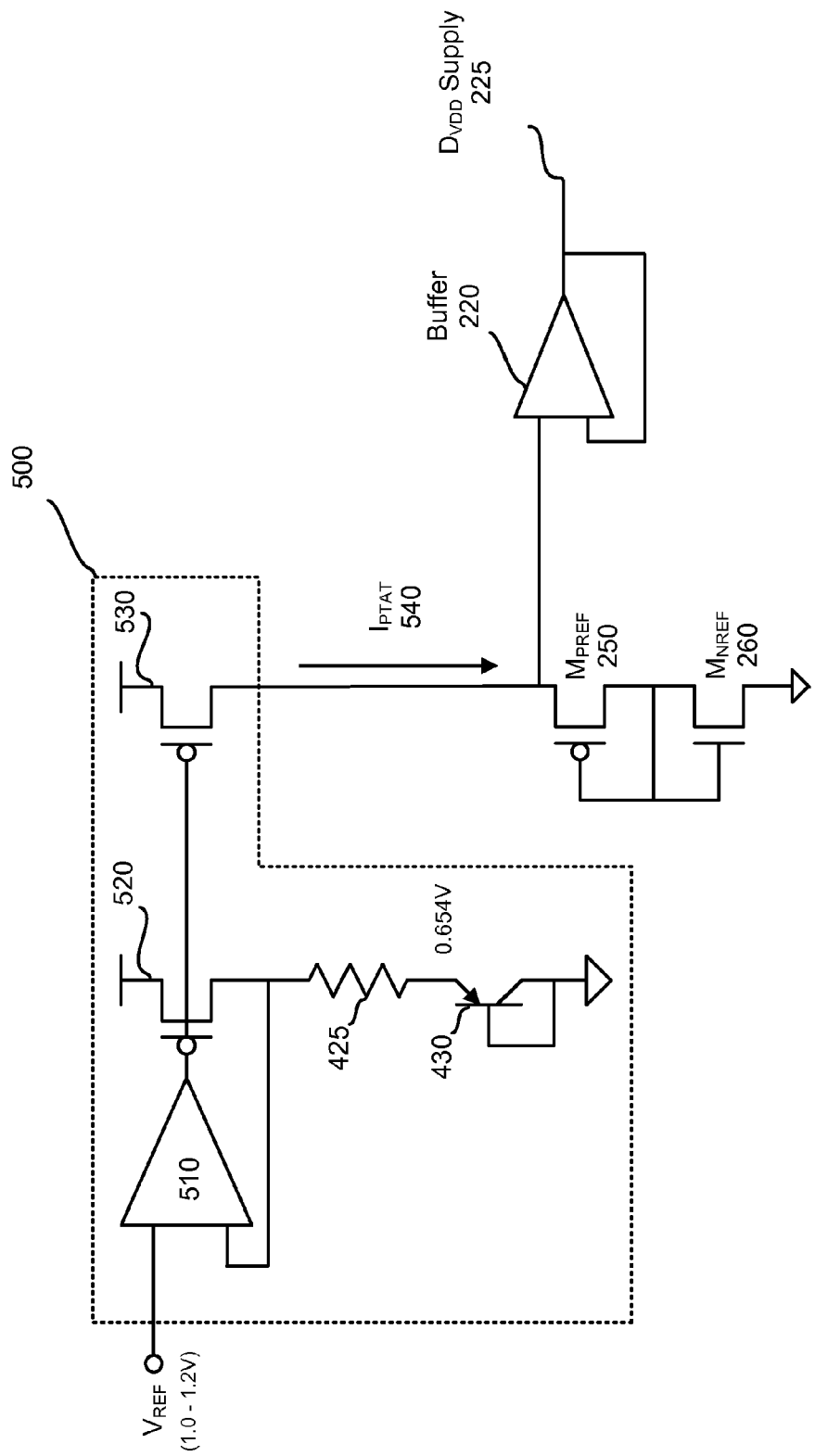
FIG. 8 is a schematic representation of a process, voltage, temperature (PVT) insensitive voltage supply that can be implemented using various embodiments.

Without PTAT devices such as those shown in FIGS. 4 and 5, it is possible to observe phase noise variation of up to 6 dB with PVT variation. The capability of embodiments such as that shown in FIG. 2 can achieve phase noise of less than 1 dB with PVT variation. Consequently, the constant $G_M$ current can vary widely. For example, at higher temperatures, where the mobility in the transistors is reduced, higher currents are needed to maintain the constant transconductance. The variation in current yields the variation in the reference voltage to the transistors, to reduce or eliminate the phase noise variation. However, since the high current is not always needed, setting the current high only when needed by the specific operating conditions, i.e. PVT, can yield significant systematic reductions in power consumption. Adjusting the slope of the current versus the temperature can be achieved using mathematical analysis, experimentation or by simulation FIG. 8 is schematic representation of a specific example of a circuit 800 that can be used to implement various embodiments. In circuit 800, circuit 500 can be used to generate the varying current $I_{PTAT}$ that will vary automatically with temperature to maintain constant transconductance, $G_M$, and transition frequency in the transistors 250 and 260. Typically, $V_{REF}$ need only be varied from 1.0V to 1.2V to produce the required performance, however other $V_{REF}$ ranges can also be helpful when dealing with extreme temperature and process corner variations.

FIG. 8 shows schematic representation of a circuit according to various embodiments. In such embodiments, a PTAT type circuit 500 can be used as the load for the buffer 220 coupled to the pMOS transistor 250. The PTAT type circuit 500 can include a BJT 430 coupled to a resistor 425. The current in the PTAT type circuit 500 will be mirrored in the current through the $M_{PREF}$ and the $M_{NREF}$ that are used to generate the voltage that is buffered by the buffer 220 that supplies the $D_{VDD}$ supply 225 for a digital circuit.

Figure 9:
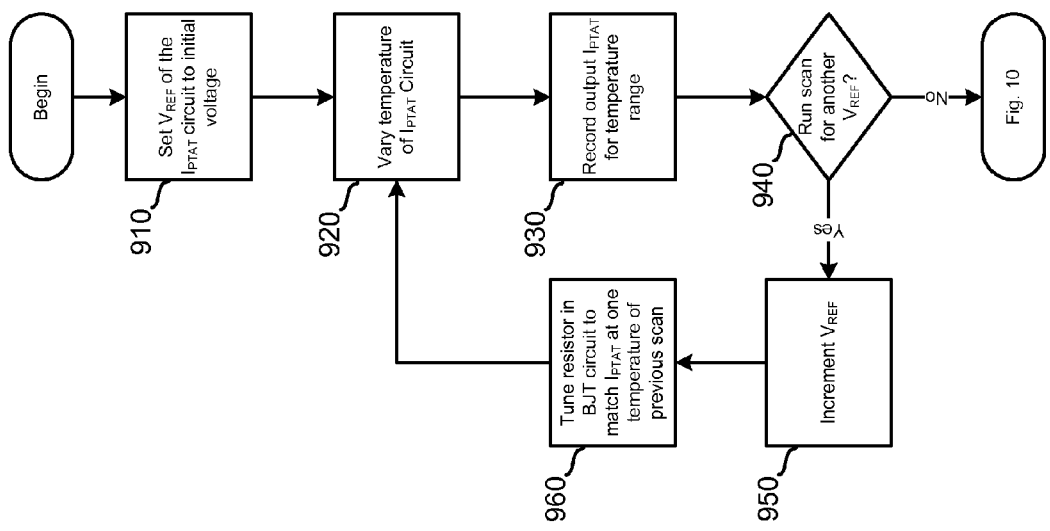
FIG. 9 is a flow chart of a method for analyzing and configuring the performance characteristics of an inverter according to various embodiments.

FIG. 9 is a flowchart of a method 900 for setting the $V_{REF}$ voltage of circuits and devices according to various embodiments to achieve the fast transition frequencies in an inverter with constant transconductance, $G_M$, and reduced or eliminate phase noise. Such methods can include a PTAT device characterization routine. For example, at 910, the $V_{REF}$ voltage of an $I_{PTAT}$ circuit can be set to an initial value. The value of the $V_{REF}$ voltage can be set high initially or low initially. Next, in 920, the temperature of the $I_{PTAT}$ circuit can be varied over some range of temperatures to determine the corresponding output $I_{PTAT}$ at each temperature point. In alternative embodiments, the temperature can be set and then the $V_{REF}$ voltages can be scanned. In either embodiment, at 930, the output of $I_{PTAT}$ can be recorded as a function of temperature and $V_{REF}$. If there are more $V_{REF}$ voltages that need to be tested, as determined at 940, the value of $V_{REF}$ voltage can be incremented, i.e. either increased or decreased at 950.

In the event that the $V_{REF}$ voltage is changed, it may be necessary to replace or tune the resistor in the $I_{PTAT}$ circuit to produce an output $I_{PTAT}$ that is equal to the output of another $V_{REF}$ voltage at a given temperature for the purpose of comparison. For example, the resistor of the $I_{PTAT}$ circuit can be tuned to scale the graphs of the various scanned $V_{REF}$ voltages so they intersect at 0 degrees Kelvin, as shown in FIG. 6. Scaling the graphs can include changing the resistance of a resistor in the $I_{PTAT}$ circuit to move the graph of the output $I_{PTAT}$ up or down, depending on the adjustment needed to have the graphs intersect at a specific temperature.

Once the appropriate resistor value is found to allow for meaningful comparison of the $V_{REF}$ voltages, then the temperatures can again be scanned and the resulting output $I_{PTAT}$ can be measured and recorded in 920 and 930. This process can continue for as many iterations as is necessary or desired to achieve the desired performance in the inverter. Once all of the desired $V_{REF}$ voltages have been scanned, the method can be passed off to the method 1000 shown in FIG. 10.

Figure 10:
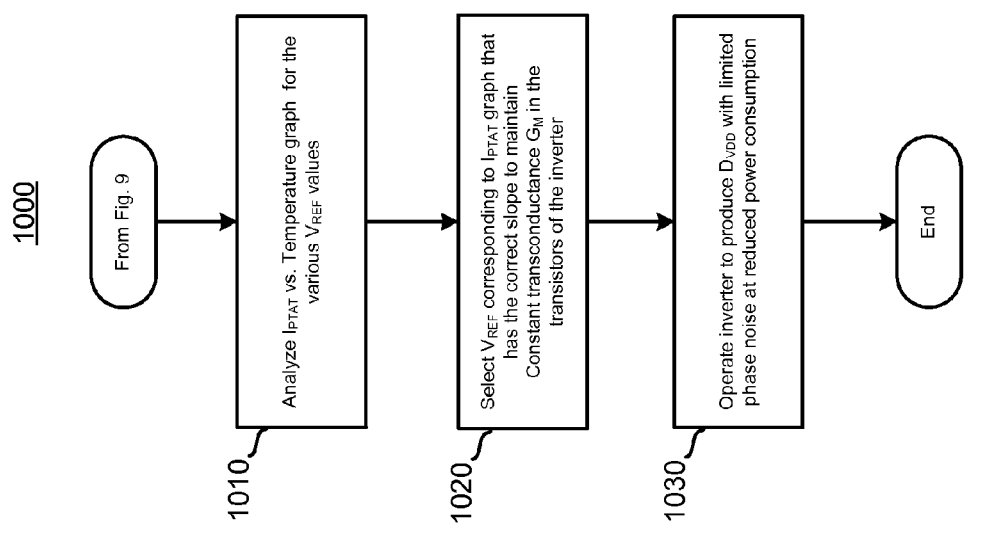
FIG. 10 is a flow chart of a method for tuning the reference voltage for a PVT insensitive inverter according to various embodiments.

FIG. 10 shows a flowchart of a method for setting the $V_{REF}$ voltage in the $I_{PTAT}$ circuit to produce the varying current necessary to maintain constant transition frequencies and transconductance in the transistors of the inverter. At 1010, the $I_{PTAT}$ versus temperature graphs for the various $V_{REF}$ voltages can be analyzed. This analysis can include examining the steepness of the slope of the $I_{PTAT}$ versus temperature graphs. In 1020, the $V_{REF}$ voltage that corresponds to the graph of $I_{PTAT}$ versus temperature with correct slope to maintain the constant $G_M$ in the transistors of the inverter can be selected. This selection can be based on the simulated or measured performance of the transistors in the inverter as a function of temperature. Finally, in 1030, the inverter can be operated with the selected $V_{REF}$ voltage to produce the $D_{VDD}$ with limited phase noise at the reduced power consumption. Embodiments of the present invention are very useful when the phase noise varies with the transconductance of the device. The $V_{DD}$ can be tuned, depending on the corner, to minimize the power consumption. Embodiments of the present disclosure can also be used in other digital topologies to sense the temperature of some other digital design. This is particularly useful in high speed circuits, but can also be used in lower speed circuit designs.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A circuit comprising:
a current source configured to (i) receive a first reference voltage, and (ii) supply an output current;
an inverter having a transconductance, wherein the inverter comprises
a first transistor having a source and a drain, wherein the source of the first transistor is connected to the current source, and wherein the source of the first transistor is configured to receive a portion of the output current, and
a second transistor having a source, wherein the source of the second transistor is connected to the drain of the first transistor; and
a device configured to select the first reference voltage such that the output current of the current source varies with changes in a temperature of the current source to (i) maintain the transconductance of the inverter at a same value, and (ii) prevent changes in respective transition frequencies of both the first transistor and the second transistor.

2. The circuit of claim 1, wherein:
for the first reference voltage, the output current of the current source varies at a first rate with the changes in the temperature of the current source; and
for a second reference voltage, the output current of the current source varies at a second rate with the changes in the temperature of the current source, wherein the second rate is different than the first rate.

3. The circuit of claim 1, wherein the device comprises the current source.

4. The circuit of claim 1, wherein:
in response to each of a plurality of voltages, the output current of the current source varies with the changes in the temperature of the current source such that (i) the transconductance of the inverter is maintained at the same value, and (ii) the respective transition frequencies of the first transistor and the second transistor are prevented from changing;
the device is configured to select the first reference voltage from the plurality of voltages; and
the first reference voltage is a lowest one of the plurality of voltages.

5. The circuit of claim 1, wherein:
the first transistor comprises a gate; and
the second transistor comprises a gate, wherein the source of the second transistor is connected to (i) the drain and the gate of the first transistor, and (ii) the gate of the second transistor.

6. The circuit of claim 1, wherein:
the current source comprises a variable resistance;
the current source is configured to (i) for a first scan of the current source, receive the first reference voltage, and (ii) in response to the first reference voltage, output a first level of current;
the current source is configured to (i) for a second scan of the current source, receive a second reference voltage instead of the first reference voltage, and (ii) in response to the second reference voltage, output a second level of current; and
the variable resistance is configured to, for a predetermined temperature of the current source, be adjusted from a first resistance to a second resistance to adjust the output current from the second level of current to the first level of current.

7. The circuit of claim 1, further comprising:
a buffer connected to the source of the first transistor, wherein the buffer is configured to (i) receive the first reference voltage, and (ii) generate a supply voltage in response to the first reference voltage; and
a divider configured to (i) receive an input signal, and (ii) based on the supply voltage and the input signal, generate an output signal.

8. The circuit of claim 1, wherein the current source comprises:
a buffer comprising a first input and a second input, wherein the first input of the buffer is configured to receive the first reference voltage, and wherein the buffer is configured to generate an output signal in response to the first reference voltage;
a third transistor comprising a gate and a drain, wherein the gate of the third transistor is configured to receive the output signal;
a variable resistor connected to the drain of the third transistor;

a fourth transistor connected to the variable resistor; and
a fifth transistor comprising a gate and a drain, wherein the gate of the fifth transistor is configured to receive the output signal, and wherein the drain of the fifth transistor is configured to provide the output current.

9. A method comprising:
receiving a first reference voltage at a current source;
generating, via the current source, an output current in response to the first reference voltage;
supplying a portion of the output current from the current source to an inverter, wherein the inverter has a transconductance, and wherein the inverter comprises
　a first transistor having a source and a drain, wherein the source of the first transistor is connected to the current source, and wherein the source of the first transistor is configured to receive the portion of the output current, and
　a second transistor having a source, wherein the source of the second transistor is connected to the drain of the first transistor; and
selecting the first reference voltage such that the output current of the current source varies with changes in a temperature of the current source to (i) maintain the transconductance of the inverter at a same value, and (ii) prevent changes in respective transition frequencies of both the first transistor and the second transistor.

10. The method of claim 9, wherein:
for the first reference voltage, the output current of the current source varies at a first rate with the changes in the temperature of the current source; and
for a second reference voltage, the output current of the current source varies at a second rate with the changes in the temperature of the current source, wherein the second rate is different than the first rate.

11. The method of claim 9, wherein:
in response to each of a plurality of voltages, the output current of the current source varies with the changes in the temperature of the current source such that (i) the transconductance of the inverter is maintained at the same value, and (ii) the respective transition frequencies of the first transistor and the second transistor are prevented from changing;
the first reference voltage is selected from the plurality of voltages; and
the first reference voltage is a lowest one of the plurality of voltages.

12. The method of claim 9, wherein:
the first transistor comprises a gate; and
the second transistor comprises a gate, wherein the source of the second transistor is connected to (i) the drain and the gate of the first transistor, and (ii) the gate of the second transistor.

13. The method of claim 9, wherein:
the current source comprises a variable resistance;
for a first scan of the current source, (i) receiving the first reference voltage at the current source, and (ii) in response to the first reference voltage, supplying a first level of current from the current source to the inverter;
for a second scan of the current source, (i) receiving a second reference voltage instead of the first reference voltage, and (ii) in response to the second reference voltage, supplying a second level of current from the current source to the inverter; and
for a predetermined temperature of the current source, adjusted the variable resistance from a first resistance to a second resistance to adjust the output current from the second level of current to the first level of current.

14. The method of claim 9, further comprising:
while the current source is receiving the first reference voltage, establishing a first current versus temperature relationship by recording output currents of the current source for a first range of temperatures, wherein the first current versus temperature relationship has a corresponding first slope;
while the current source is receiving a second reference voltage, establishing a second current versus temperature relationship by recording output currents of the current source for a second range of temperatures, wherein the second current versus temperature relationship has a corresponding second slope;
based on the first slope and the second slope, determining whether the second current versus temperature relationship provides less variance in the transconductance than the first current versus temperature relationship; and
selecting the second reference voltage in response to determining the second current versus temperature relationship provides less variance in the transconductance than the first current versus temperature relationship.

15. The method of claim 9, further comprising:
during a first scan and while the current source is receiving the first reference voltage, recording output currents of the current source for a plurality of temperatures;
during a second scan and while the current source is receiving a second reference voltage, recording output currents of the current source for the plurality of temperatures; and
tuning a variable resistance of the current source based on results of the first scan and the second scan.

16. The method of claim 9, further comprising:
during a first scan and while the current source is at a first temperature, recording output currents of the current source for a plurality of reference voltages;
during a second scan and while the current source is at a second temperature, recording output currents of the current source for the plurality of reference voltages; and
tuning a variable resistance of the current source based on results of the first scan and the second scan.

17. The method of claim 9, further comprising:
analyzing current versus temperature relationships for a plurality of reference voltages; and
selecting the first reference voltage based on results of the analyzing of the current versus temperature relationships,
each of the current versus temperature relationships has a corresponding slope; and
the first reference voltage corresponds to the current versus temperature relationship having a slope with a minimum corresponding variance in the transconductance.

18. A method comprising:
selecting a first reference voltage;
receiving the first reference voltage at a current source;
based on the reference voltage, generating a output current via the current source;
recording a level of current output from the current source while (i) the current source is at a predetermined temperature, and (ii) the current source is receiving the first reference voltage;
subsequent to recording the level of current, selecting a second reference voltage, wherein the second reference voltage is different than the first reference voltage;
supplying the second reference voltage instead of the first reference voltage to the current source; and
tuning a variable resistance of the current source to match (i) the output current of the current source generated while the temperature of the current source is at the predetermined temperature and while the current source is receiving the first reference voltage to (ii) the level of current output from the current source while the temperature of the current source was at the predetermined temperature and while the current source is receiving the second reference voltage.

19. The method of claim 18, further comprising:
while the current source is receiving the first reference voltage, establishing a first current versus temperature relationship by recording output currents of the current source for a first range of temperatures, wherein the first current versus temperature relationship has a corresponding first slope;
while the current source is receiving the second reference voltage, establishing a second current versus temperature relationship by recording output currents of the current source for a second range of temperatures, wherein the second current versus temperature relationship has a corresponding second slope;
based on the first slope and the second slope, determining whether the second current versus temperature relationship provides less variance in a transconductance than the first current versus temperature relationship, wherein the transconductance is of an inverter; and
selecting the second reference voltage in response to determining the second current versus temperature relationship provides less variance in the transconductance than the first current versus temperature relationship.

20. The method of claim 18, wherein the output current of the current source varies with changes in a temperature of the current source.

21. The method of claim 18, further comprising selecting the first reference voltage such that a predetermined criteria is satisfied, wherein:
the predetermined criteria includes the output current of the current source
varying with changes in a temperature of the current source, and
being at a level to (i) maintain a transconductance of an inverter at a same value, and (ii) prevent changes in transition frequencies of transistors of the inverter; and
a plurality of reference voltages satisfy the predetermined criteria; and
the first reference voltage is a lowest one of the plurality of reference voltages satisfying the predetermined criteria.

22. The method of claim 21, further comprising:
receiving the first reference voltage at a buffer;
generating, via the buffer, a supply voltage in response to the first reference voltage, wherein the buffer is connected to a source of one of the transistors of the inverter;
receiving an input signal at a divider; and
based on the supply voltage and the input signal, generating an output signal.

23. The method of claim 18, further comprising:
receiving the first reference voltage at a first input of a first buffer, wherein the current source comprises the first buffer;
generating, via the first buffer, an output signal in response to the first reference voltage;
receiving the output signal at a gate of a transistor of the current source; and
providing the output current from a drain of the transistor to a second buffer.

* * * * *